United States Patent
Akai et al.

(10) Patent No.: US 7,687,987 B2
(45) Date of Patent: Mar. 30, 2010

(54) ORGANIC ELECTROLUMINESCENT HAVING A TRANSPARENT ELECTROCONDUCTIVE LAYER FORMED ON A LIGHT EMITTING LAYER

(75) Inventors: Tomonori Akai, Tokyo-to (JP); Shigehiro Ueno, Tokyo-to (JP)

(73) Assignee: Dai Nippon Printing Co., Ltd., Tokyo-to (JP)

( * ) Notice: Subject to any disclaimer, the term of this patent is extended or adjusted under 35 U.S.C. 154(b) by 261 days.

(21) Appl. No.: 11/690,933

(22) Filed: Mar. 26, 2007

(65) Prior Publication Data

US 2007/0228942 A1  Oct. 4, 2007

(30) Foreign Application Priority Data

Mar. 28, 2006 (JP) .............................. 2006-089176

(51) Int. Cl.
*H01J 1/62* (2006.01)
*H01J 63/04* (2006.01)

(52) U.S. Cl. ............... 313/504; 313/483; 313/498; 313/500; 313/501; 313/502; 313/503; 313/505; 313/506

(58) Field of Classification Search ............ None
See application file for complete search history.

(56) References Cited

U.S. PATENT DOCUMENTS

| | | | | |
|---|---|---|---|---|
| 5,734,225 A | * | 3/1998 | Biebuyck et al. | 313/512 |
| 5,739,545 A | * | 4/1998 | Guha et al. | 257/40 |
| 6,284,393 B1 | * | 9/2001 | Hosokawa et al. | 428/690 |
| 6,716,662 B2 | * | 4/2004 | Akai | 438/99 |
| 2005/0285521 A1 | * | 12/2005 | Menda | 313/512 |

FOREIGN PATENT DOCUMENTS

| | | |
|---|---|---|
| JP | 10-162959 | 6/1998 |
| JP | 10-223377 | 8/1998 |
| JP | 2003-77651 | 3/2003 |
| JP | 2004-127740 | 4/2004 |
| JP | 2004-227943 | 8/2004 |
| JP | 2004-296234 | 10/2004 |

\* cited by examiner

*Primary Examiner*—Nimeshkumar D. Patel
*Assistant Examiner*—Natalie K Walford
(74) *Attorney, Agent, or Firm*—Ladas & Parry LLP

(57) ABSTRACT

A main object of the present invention is to provide an organic EL element being excellent in light emitting characteristics, characteristics of an organic EL layer and current-voltage characteristic. To attain the object, the invention discloses—an organic electroluminescent element comprises a substrate, an anode layer formed on the substrate, an organic electroluminescent layer formed on the anode layer and—containing at least a light emitting layer, a semitransparent cathode layer formed on the organic electroluminescent layer, a transparent buffer layer formed on the semitransparent cathode layer and having an impact buffering function, and a transparent electroconductive protection layer formed on the transparent buffer layer and having an oxidation preventing function. A contact region in which the semitransparent cathode layer and the transparent electroconductive protection layer contact with each other is provided in a non-display area.

4 Claims, 1 Drawing Sheet

ORGANIC ELECTROLUMINESCENT HAVING A TRANSPARENT ELECTROCONDUCTIVE LAYER FORMED ON A LIGHT EMITTING LAYER

BACKGROUND OF THE INVENTION

1. Field of the Invention

The present invention relates to an organic electroluminescent element in which a transparent electroconductive layer is formed on a light emitting layer by such as a sputtering method.

2. Description of the Related Art

The organic electroluminescent (which may be hereinafter abbreviated as EL) element in which the light emitting layer is sandwiched between a pair of electrodes and light is emitted by applying voltage between the electrodes has advantages such as follows: high visibility due to self light emission, excellent impact resistance because it is an entirely solid element unlike a liquid crystal element, a high response speed, less susceptibility to temperature changes, and a large viewing angle. Thus, the EL element is attracting attention for applications as light emitting elements in display devices.

The organic EL element fundamentally takes a laminated structure of an anode layer/a light emitting layer/a cathode layer. Conventionally, it is a general practice that the anode layer as a transparent electroconductive layer is laminated on a transparent substrate such as a glass substrate, and a light emitting layer and a cathode layer are subsequently laminated on the anode layer. Thus, a bottom emission type in which light is taken out of a side of the anode layer has been employed.

On the other hand, a top emission type in which a cathode layer is designed as a transparent electroconductive layer and light is taken out of a side of the cathode layer has recently been noted. With realization of the top emission type, if the cathode and the anode are designed as transparent electroconductive layers, an entirely transparent light emitting element can be obtained, which can realize light emission from both faces of the element. Since an arbitrary color can be adopted as a background color for such a transparent light emitting element, the element can make a display device which retains a colored state even at a time when it emits no light, and thereby enhance decorativeness. Further, since the emission of the light is not shielded in the top emission type by TFTs (thin film transistors) in case of an active driving display device, the display device having a high aperture ratio can be provided.

As an example of the top emission type organic EL element, an organic EL element is disclosed, in which an organic light emitting layer is formed between an anode layer and a cathode layer, the cathode layer is composed of an electron injecting layer and a transparent electroconductive layer, and the electron injecting layer is arranged on a side of the organic light emitting layer (Japanese Patent Application Laid-Open (JP-A) 10-1162959).

However, in the case of the top emission type organic EL element, a transparent electroconductive film layer made of ITO or the like is generally formed by a sputtering method. Therefore, when the transparent electroconductive layer is formed on the light emitting layer, members such as the light emitting layer, the electron injecting layer and the hole injecting layer are impacted with such as sputtered particles, $Ar^+$ and ionized electrons at the time of the sputtering. Consequently, there was a problem that the light emitting characteristics are deteriorated (reduction in the current density, reduction in the light emitting efficiency, and the current leakage). In addition, when plasma is used to form the transparent electroconductive layer, there was a problem that the light emitting layer was exposed to a plasma atmosphere and the light emitting characteristics were likely to be deteriorated. Furthermore, there was another problem that when oxygen is introduced or oxygen is released from a target in forming the transparent electroconductive layer, there was a problem that a highly reactive metal contained in the electron injecting layer was oxidized, thereby deteriorating the characteristics of the electron injecting layer (reduction in the current density, reduction in the light emitting efficiency and the enlargement of dark spots).

In order to solve such problems, trials have been made to form various layers between the light emitting layer and the transparent electroconductive layer (upper electrode). For example, there are disclosed an organic EL element in which a sputtering protection layer made of gold, nickel or aluminum is formed between a light emitting layer and a transparent electroconductive layer (JP-A2003-77651); an organic EL element in which a cathode layer is designed as a two-layer structure and between first and second cathode layers is formed an electron transporting protecting layer made of an electron transporting organic material such as bathocuproin (BCP) doped with an alkali metal or alkaline earth metal (such as Li, Cs, Ba, Sr, Ca) (JP-A2004-127740); an organic EL element in which a cathode layer has a thin metal layer and this thin metal layer is covered with a protective layer made of a semiconductor (ZnSe or the like) having a wide band gap (JP-A10-223377); an organic EL element in which a hole injecting layer having a thickness of 30 to 1000 nm is formed between an organic light emitting layer and an upper transparent anode layer (JP-A2004-227943); and an organic EL element in which between an organic EL layer and a transparent electroconductive layer is formed a buffer layer made of a phthalocyanine compound doped with a metal such as Au, Pt or Ag (JP-A2004-296234).

However, when various layers are inserted between the light emitting layer and the transparent electroconductive layer (upper electrode) as mentioned above, obviously, transparency are required for those layers. Unless the electron transporting property and the electron injecting property of those layers are sufficiently high, there were problems that the electric resistance of the entire element became higher, that the current-voltage characteristic was deteriorated, and that balance between the holes and the electrons injected into the light emitting layer was disrupted, so that the light emitting characteristics were deteriorated.

SUMMARY OF THE INVENTION

The present invention has been accomplished in view of the above-mentioned problems, and it is a main object of the present invention to provide an organic EL element being excellent in light emitting characteristics, characteristics of an organic EL layer and current-voltage characteristic.

To achieve the object, the present invention provides an organic electroluminescent element comprising: a substrate, an anode layer formed on the substrate, an organic electroluminescent layer formed on the anode layer and containing at least a light emitting layer, a semitransparent cathode layer having transparency or semitransparency and formed on the organic electroluminescent layer, a transparent buffer layer formed on the semitransparent cathode layer and having an impact buffering function, and a transparent electroconductive protection layer formed on the transparent buffer layer and having an oxidation preventing function, wherein a contact region in which the semitransparent cathode layer and the transparent electroconductive protection layer contact with each other is provided in a non-display area.

According to the present invention, since the transparent buffer layer having the impact buffering function is formed between the organic EL layer and the transparent electroconductive protection layer, damage upon the organic EL layer can be reduced at the time of forming the transparent electroconductive protection layer. Further, since the transparent electroconductive protection layer having the oxidation preventing function is formed on the semitransparent cathode layer, when the semitransparent cathode layer or the organic EL layer contains a highly reactive metal, the metal can be prevented from being oxidized with ambient oxygen. Therefore, reduction in the light emitting characteristics, reduction in the electron injecting function, and reduction in the characteristics of the organic EL layer can be suppressed.

In addition, according to the present invention, the contact region in which the semitransparent cathode layer and the transparent electroconductive protection layer contact with each other is provided in the non-display area, without transparent buffer layer presented between the organic EL layer and the semitransparent cathode layer. Therefore, current flows through the semitransparent cathode layer, and also through the transparent electroconductive protection layer. Consequently, electrons can be effectively supplied to the light emitting layer, and the light emitting efficiency can be improved.

In the above-mentioned invention, it is preferable that a value obtained by dividing a resistivity of the transparent electroconductive protection layer provided on the non-display area by a film thickness of the transparent electroconductive protection layer is less than that obtained by dividing a resistivity of the semitransparent cathode layer provided on the non-display area by a film thickness of the semitransparent cathode layer, and the transparent electroconductive protection layer provided on the non-display area functions as a bus electrode of the semitransparent cathode layer. Thereby, electroconductivity of the semitransparent cathode layer is assisted by the transparent electroconductive protection layer in the non-display area.

In the present invention, the transparent electroconductive protection layer is preferably made of an electroconductive inorganic oxide. In general, a film of the electroconductive inorganic oxide is formed by such as a sputtering method, and thus the dense film can be obtained. The oxidation preventing function can be improved by using the electroconductive inorganic oxide for the transparent electroconductive protection layer. Moreover, since the electroconductive inorganic oxide has relatively high electroconductivity, the transparent electroconductive protection layer made of the electroconductive inorganic oxide is advantageous for assisting the electroconductivity of the semitransparent cathode layer. Furthermore, since the electroconductive inorganic oxide has relatively high transparency, light from the light emitting layer can be effectively taken out, and a design feature can be enhanced.

In the present invention, the semitransparent cathode layer preferably contains an alkali metal alone, an alkaline earth metal alone, an oxide of the alkali metal, an oxide of the alkaline earth metal, a fluoride of the alkali metal, a fluoride of the alkaline earth metal, or an organic complex of the alkali metal. When such a highly reactive material is used for the semitransparent cathode layer, injection of electrons into the light emitting layer can be improved, but the electroconductivity is likely to decrease due to the oxidation occurred by the high reactivity. On the other hand, since the transparent electroconductive protection layer having the oxidation preventing function is formed on the semitransparent cathode layer as mentioned above, the alkali metal and the alkaline earth metal can be prevented from being oxidized. Further, in general, since each of the above-mentioned materials can be formed in a filmy fashion by a vacuum deposition method or the like, the semitransparent cathode layer can be formed without damaging the organic EL layer.

According to the present invention, since the transparent buffer layer having the impact buffering function is formed between the organic EL layer and the transparent electroconductive protection layer, damage upon the organic EL layer can be reduced at the time of forming the transparent electroconductive protection layer. Further, the transparent electroconductive protection layer having the oxidation preventing function is formed on the semitransparent cathode layer. Therefore, when the semitransparent cathode layer or the organic EL layer contains a highly reactive metal, the metal can be prevented from being oxidized with ambient oxygen. Furthermore, since the contact region in which the semitransparent cathode layer and the transparent electroconductive protection layer contact with each other is provided in the non-display area, the electron conductivity can be improved. Thus, reduction in the light emitting characteristics and reduction in the characteristics of the organic EL layer can be suppressed, and the current-voltage characteristic can be improved.

DESCRIPTION OF THE PREFERRED EMBODIMENT

In the following, the organic EL element and a functional device according to the present invention will be explained in detail.

A. Organic EL Element

An organic electroluminescent element of the present invention comprises a substrate, an anode layer formed on the substrate, an organic electroluminescent layer formed on the anode layer and containing at least a light emitting layer, a semitransparent cathode layer formed on the organic electroluminescent layer, a transparent buffer layer formed on the semitransparent cathode layer and having an impact buffering function, and a transparent electroconductive protection layer formed on the transparent buffer layer and having an oxidation preventing function, wherein a contact region in which the semitransparent cathode layer and the transparent electroconductive protection layer contact with each other is provided in a non-display area.

Figure 1:
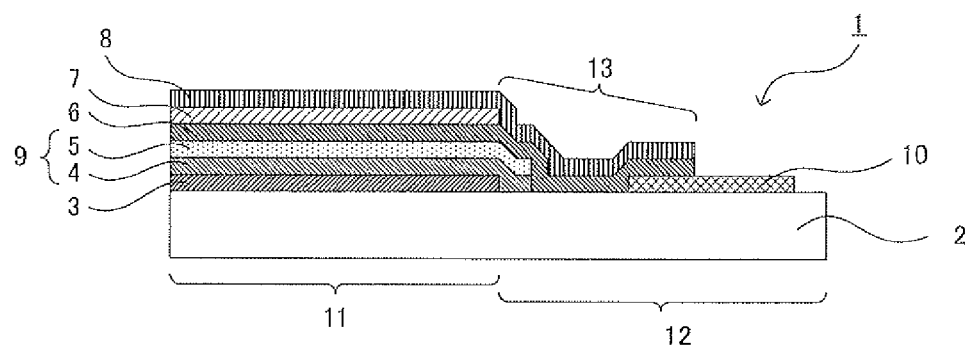
FIG. 1 is an outlined cross sectional view showing one example of the organic EL element according to the present invention.

The organic EL element according to the present invention will be explained with reference to the drawing. FIG. 1 is an outlined cross sectional view showing one example of the organic EL element according to the present invention. As illustrated in FIG. 1, the organic EL element 1 comprises: an anode layer 3, a hole injecting and transporting layer 4, a light emitting layer 5, a semitransparent cathode layer 6, a transparent buffer layer 7 and a transparent electroconductive protection layer 8 laminated sequentially on a substrate 2 in this order. An organic EL layer 9 is constituted by the hole injecting and transporting layer 4 and the light emitting layer 5. The semitransparent cathode layer 6 contacts with a cathode take-out electrode 10. The transparent buffer layer 7 has the impact buffering function, and the transparent electroconductive protection layer 8 has the oxidation preventing function. In a display area 11, the light emitting layer 5 is held between the anode layer 3 and the semitransparent cathode layer 6, and the light emitted from the light emitting layer 5 is taken out of a side of the semitransparent cathode layer 6. The contact region 13 in which the semitransparent cathode layer 6 and the transparent electroconductive protection layer 8 contact with each other is provided in a non-display area 12.

In such an organic EL element, the transparent buffer layer having the impact buffering function is formed between the organic EL layer and the transparent electroconductive protection layer. Therefore, when the transparent electroconductive protection layer is formed by the sputtering method or the like, impact upon the organic EL layer with such as plasma gas ions, sputtered particles, ionized electrons can be buffered at the time of sputtering. Therefore, reduction in the light emitting characteristics can be suppressed.

Moreover, the transparent electroconductive protection layer having the oxidation preventing function is formed on the semitransparent cathode layer. Therefore, when the semitransparent cathode layer contains a highly reactive metal, the semitransparent cathode layer is protected from ambient oxygen by the transparent electroconductive protection layer, and the metal can be prevented from being oxidized with the ambient oxygen. Further, when the semitransparent cathode layer contains the highly reactive metal, there is a risk that the metal contained in the semitransparent cathode layer is oxidized through the introduction of oxygen or release of oxygen from a target during the formation of the transparent electroconductive protection layer, and the electron injecting function is lost. However, since the transparent buffer layer is formed between the semitransparent cathode layer and the transparent electroconductive protection layer, the semitransparent cathode layer is protected with the transparent buffer layer, so that the metal can be prevented from being oxidized when the transparent electroconductive protection layer is formed. Therefore, reduction in the electron injecting function of the semitransparent cathode layer can suppressed.

In organic EL element 1 illustrated in FIG. 1, when voltage is applied between the anode layer 3 and the semitransparent cathode layer 6, electrons flow into the organic EL layer 9 from the cathode take-out electrode 10 through the semitransparent cathode layer 6, and the semitransparent cathode layer 6 functions as an electroconductive passage. At this time, since the semitransparent cathode layer 6 and the transparent electroconductive protection layer 8 contact with each other in the contact region 13 of the non-display area 12, the transparent electroconductive protection layer 8 assists the electroconductivity of the semitransparent cathode layer 6. Accordingly, electrons also flow through the transparent electroconductive protection layer 8, and it functions also as an electroconductive passage. That is, the transparent electroconductive protection layer provided in the non-display area functions as a bus electrode for the semitransparent cathode layer, so that the electron conductibility is improved. Thus, electrons can be efficiently supplied to the light emitting layer.

In addition, the transparent butter layer 7 having the impact buffering function is formed on the semitransparent cathode layer 6, and no transparent buffer layer is present between the semitransparent cathode layer 6 and the organic EL layer 9. Therefore, as compared with a conventional case where the transparent buffer layer is formed between the semitransparent cathode layer and the organic EL layer, the electric resistance can be lowered, and the electrons can be smoothly transported to the light emitting layer.

Therefore, the light emitting efficiency can be improved, and excellent current-voltage characteristic can be obtained In addition, in the organic EL element 1 illustrated in FIG. 1, when the cathode take-out electrode 10 is made of an electroconductive inorganic oxide such as ITO, the metal contained in the semitransparent cathode layer may be oxidized through a reaction with oxygen contained in the cathode take-out electrode in the region where the semitransparent cathode layer 6 contacts the cathode take-out electrode 10. In this case, there is a risk that the electroconductivity of the semitransparent cathode layer might decrease in the region where the semitransparent cathode layer and the cathode take-out electrode contact with each other. However, since the contact region 13 in which the semitransparent cathode layer 6 and transparent electroconductive protection layer 8 contact with each other is provided in the non-display area 12, the transparent electroconductive protection layer can supplement reduction in the electroconductivity of the semitransparent cathode layer, even if the electroconductivity of the semitransparent cathode layer is partially decreased by the influence of the oxygen contained in the cathode take-out electrode.

Hereafter, each of components of the organic EL element according to the present invention will be explained.

1. Transparent Buffer Layer

The transparent buffer layer used in the present invention is formed between the semitransparent cathode layer and the transparent electroconductive protection layer, and has the impact buffering function. The organic EL layer including such as the light emitting layer, the hole injecting and transporting layer, and the electron injecting and transporting layer as well as the semitransparent cathode layer are protected by this transparent buffer layer, when the transparent electroconductive protection layer is formed.

The material for forming the transparent buffer layer is not particularly limited, so long as it affords the impact buffering function and exhibits transparency in a film thickness required to obtain a sufficient impact buffering function. As the material for the formation of the transparent buffer layer, use may be made, for example, of (1) organic materials and inorganic materials which are doped with a metal having a high electron injecting property, such as an alkali metal or an alkaline earth metal; (2) organic materials doped with a metal having a low or no electron injecting property; (3) inorganic materials doped with a metal having a low or no electron injecting property; (4) organic materials exhibiting high electron mobility by themselves, (5) inorganic materials exhibiting high electron mobility by themselves; and (6) electrically insulating organic materials and electrically insulating inorganic materials.

In the case of the above-mentioned organic materials (1) doped with the metals having the high electron injecting property, such as the alkali metal or alkaline earth metal, Li, Cs, Ba, Sr, and Ca may be recited as examples of the doped alkali metal or alkaline earth metal. Further, bathocupuroin (BCP) and bathophenanthroline (Bphen) can be recited as examples of the organic materials doped with such alkali metals or alkaline earth metals. In this case, the molar ratio between the organic material and the metal dopant in the transparent buffer layer is preferably around 1:1 to around 1:3, and more preferably around 1:1 to around 1:2.

In the case of the above-mentioned organic materials (2) doped with the metals having the low or no electron injecting property, Be, Mg, Sc, Y, Zr, Hf, V, Nb, Ta, Cr, Mo, W, Mn, Tc, Re, Fe, Ru, Os, Co, Rh, Ir, Ni, Pd, Pt, Cu, Ag, Au, Zn, Cd, Hg, Al, Ga, In, Ti, Sn, Pb, and Bi are recited as examples of the doped metals. Among them, the metal whose work function is 3.0 eV or more is preferable. As the organic materials to be doped with such metals, a phthalocyanine compound is recited, for example. Concretely, CuPc, $H_2$—Pc, Al—PCc, TiO—Pc, Fe—Pc, Co—Pc and Sn—Pc are recited as examples.

In this case, the content of the metal dopant in the transparent buffer layer is such that when the layer is formed in a filmy fashion by a vapor co-deposition method, the ratio in terms of the film thickness between the organic material and the metal dopant is preferably around 300:1 to around 30:1, more preferably around 120:1 to around 80:1.

In the case of the above-mentioned inorganic materials (3) doped with the metals having the low or no electron injecting property, those similar to ones in the above-mentioned (2) are recited as the doped metals. Moreover, as the inorganic materials to be doped with these metals, oxides, nitride, fluoride, sulfide of the metal or the semiconductor, and mixtures of any of them can be used as examples.

In this case, the content of the metal dopant (concentration of the metal) in the transparent buffer layer is preferably not more than 30% by volume. Because, the transparent buffer layer might become opaque, if the content of the metal dopant is too high.

The above-mentioned organic materials (4), which exhibit high electron mobility by themselves, contain no metal dopant. As the organic materials, which exhibit the high electron mobility by themselves, recitation may be made, for example, of quinoline derivatives such as tris(8-quinolinolato) aluminum complex (Alq3); oxadiazole derivatives such as 2,5-bis(1-naphthyl)-1,3,4-oxadiazol (BND), or 2-(4-tert-butylphenylyl)-5-(4-biphenyl)-1,3,4-oxadiazole (PBD); triazole derivatives such as 3-(4-tert-butylphenyl) 4-phenyl-5 (4-biphenylyl)-1,2,4-triazoles (TAZ); triazine derivatives; phenanthroline derivatives such as bathocuproin (BCP); carbazole biphenyl derivatives such as 4',4-dicarbazole biphenyl (CBP); silole derivatives; perylene derivatives; pyridine derivatives; pyrimidine derivatives; quinoxaline derivatives; cyclopentadiene derivatives; bisstyrylbenzene derivatives; distyrylbenzene derivatives; distyrylpyrazine derivatives; diphenyl quinone derivatives; and nitro-substituted fluorene derivatives. Further, as the above-mentioned organic material, N, and N'-bis-(3-methylphenyl)-N,N'-bis-(phenyl)-benzidine (TPD) can be cited for example.

The above-mentioned inorganic materials (5) which exhibit the high electron mobility by themselves, contain no metal dopant. As such an inorganic material which exhibits the high electron mobility by itself, semiconductors having wide bandgaps, such as compounds constituted by elements in Groups II and VI of Periodic Table, are recited, for example. Specifically, ZnSe, ZnS, and $ZnS_xSe_{1-x}$ can be recited as examples.

As the electrically insulating organic material and the electrically insulating inorganic material in the above-mentioned (6), oxides, nitrides, fluorides and sulfides of metals or semiconductors, mixtures of any of them, or resins can be recited as examples.

Moreover, the transparent buffer layer is transparent, and its average transmittance in the visible light region (380 nm to 780 nm) is preferably not less than 10%, and more preferably not less than 40%. In this case, it is possible to design the organic EL element as being suitable for the top emission type.

The above-mentioned average transmittance is a value measured at room temperature in the atmosphere by using an ultraviolet-visible light spectrophotometer UV-2200A (manufactured by Shimadzu Corporation).

The thickness of the transparent buffer layer only has to be a thickness that permits the layer to exert the impact buffering function and satisfy the above-mentioned transmittance. The thickness is properly set according to the kind of the material used for the transparent buffer layer and the formation process of the transparent electroconductive protection layer. Specifically, the thickness of the transparent buffer layer is preferably in a range of 1 nm to 1000 nm, and more preferably in a range of 50 nm to 500 nm. This is because the impact buffering function might not be exhibited enough, if the thickness of the transparent buffer layer is smaller than the above-mentioned range. On the other hand, it might be that the transmittance decreases or the film-forming time period becomes longer if the thickness of the transparent buffer layer is greater than the above-mentioned range. Further, if the thickness of the transparent buffer layer is greater than that of the above-mentioned range, the semitransparent cathode layer is spaced too much from the transparent electroconductive protection layer, and the oxidation preventing effect of the metal with the transparent electroconductive protection layer might not be sufficiently obtained.

The formation process for the transparent buffer layer is not particularly limited, so long as the method affords no influence upon the organic EL layer including such as the light emitting layer. For example, the chemical vapor phase growth method, the physical vapor phase growth deposition method such as vacuum deposition method, sputtering method, and ion plating method are recited. Among them, the chemical vapor phase growth method and the vacuum deposition method are preferred. This is because, the kinetic energy of a gasified material is low in the chemical vapor phase growth method and the vacuum deposition method so that the energy given to the organic EL layer including such as the light emitting layer is small.

Moreover, a coating method can be used as the formation process for the transparent buffer layer. When the transparent buffer layer is formed in a filmy fashion, it can be laminated (transferred) on the semitransparent cathode layer directly or via an adhesive.

Especially, the vacuum deposition method is suitable as the formation process for the transparent buffer layer. This is because, the vacuum deposition method has not only the above-mentioned advantage, but also a reactive gas, such as oxygen, is not introduced therein. For this reason, even if the semitransparent cathode layer contains a highly reactive metal, the oxidation of this metal can be avoided.

Therefore, it is a preferable that an unreactive gas such as a rare gas is introduced in the use of the CVD method, the sputtering method and the ion plating method, without the introduction of the reactive gas such as oxygen gas.

As the vacuum deposition method, a resistance heating vapor deposition method, a flash vapor deposition method, an arc vapor deposition method, a laser vapor deposition method, a high-frequency heating vapor deposition method, and an electron beam vapor deposition method can be recited as examples.

2. Transparent Electroconductive Protection Layer

The transparent electroconductive protection layer used in the present invention is formed on the transparent buffer layer, and possesses the oxidation preventing function. When the semitransparent cathode layer or the electron injecting layer constituting the organic EL layer comprises a highly reactive metal, the transparent electroconductive protection layer can prevent the metal from being oxidized with ambient oxygen.

The transparent electroconductive protection layer preferably has electroconductivity higher than that of the semitransparent cathode layer. Specifically, it is preferable that a value obtained by dividing a resistivity of the transparent electroconductive protection layer provided on the non-display area by a film thickness of the transparent electroconductive protection layer is less than that obtained by dividing a resistivity of the semitransparent cathode layer provided on the non-display area by a film thickness of the semitransparent cathode layer. That is, the transparent electroconductive protection layer preferably functions as a bus electrode for the semitransparent cathode layer. By this, the electroconductivity of the semitransparent cathode layer is assisted by the transparent electroconductive protection layer in the non-display, so that electron conductivity can be enhanced.

When the resistance of the transparent electroconductive protection layer is smaller than that of the semitransparent cathode layer in the non-display area, the cathode take-out electrode, the semitransparent cathode layer and the transparent electroconductive protection layer form an electroconductive passage. For instance, in organic EL device 1 shown in FIG. 1, electrons flow from the cathode take-out electrode 10 to the semitransparent cathode layer 6 and the transparent electroconductive protection layer 8, and further to the semitransparent cathode layer 6, thereby supplying electrons to the light emitting layer 5. Moreover, for instance, in the organic EL device shown in FIG. 2, electrons flow from the cathode take-out electrode 10 to transparent electroconductive protection layer 8, and further to the semitransparent cathode layer 6, thereby supplying electrons to the light emitting layer 5. Thus, the transparent electroconductive protection layer provided in the non-display area functions as a bus electrode of the semitransparent cathode layer so that the electron conductibility can be improved to effectively supply electrons to the light emitting layer.

The material for forming the transparent electroconductive protection layer is not particularly limited, so long as it has transparency and affords the oxidation preventing function. For instance, since damage upon the organic EL layer to be caused by the impact when the transparent electroconductive protection layer is formed can be alleviated by the transparent buffer layer, the material for forming the transparent electroconductive protection layer may be a material which has a high melting point and is formed in a filmy fashion only by a method affording high energy at the time of the film formation, such as the sputtering method or the ion plating method.

Among them, the material for forming the transparent electroconductive protection layer preferably possesses electroconductivity higher than that of the forming material for the semitransparent cathode layer in order that the transparent electroconductive protection layer may function as the bus electrode for the semitransparent cathode layer.

As such an electroconductive material, electroconductive inorganic oxides such as In—Sn—O (indium tin oxide; ITO), In—Zn—O (indium zinc oxide; IZO), In—O, Zn—O, Zn—O—Al, and Zn—Sn—O, or α-Si and α-SiC are recited.

Further, as the above-mentioned electroconductive material, single metals having relatively low reactivity such as Ag can be recited.

Among them, the electroconductive inorganic oxide is suitable as the material for forming the transparent electroconductive protection layer. The electroconductive inorganic oxide is advantageous in that it can be formed in a filmy fashion by such as the sputtering method or the ion plating method, and the inorganic oxide can afford a dense film so as to exhibit the oxidation preventing function. Furthermore, the electroconductive inorganic oxide has a relatively high electroconductivity, and is advantageous in that the transparent electroconductive protection layer functions as the bus electrode for the semitransparent cathode layer.

The transparent electroconductive protection layer is transparent, and its average transmittance in the visible light region (380 nm-780 nm) is preferably not less than 10%, and more preferably not less than 50%. The measuring method for the average transmittance is the same as that described for the abovementioned transparent buffer layer.

Further, the thickness of the transparent electroconductive protection layer is not particularly limited, and is properly set according to the electroconductive material used. Specifically, the thickness of the transparent electroconductive protection layer is preferably in a range of 40 nm to 500 nm when the electroconductive inorganic oxide is used, and preferably in a range of 1 nm to 500 nm when a single metal is used. This is because, if the thickness of the transparent electroconductive protection layer is too small, it may be that the resistance rises or the oxidation preventing function decreases. On the other hand, if the thickness of the transparent electroconductive protection layer is too large, the transmittance might become low.

As the formation process for the transparent electroconductive protection layer, recitation is made, for example, of the chemical vapor phase growth method, and the physical vapor deposition methods such as the vacuum vapor deposition method, the sputtering method and the ion plating method. Among them, the sputtering method and the ion plating method are preferable. This is because, since these methods have high energy for the film formation, they can form a film of a material having a high melting point, such as the electroconductive inorganic oxide, and the film-forming efficiency is good.

3. Semitransparent Cathode Layer

The semitransparent cathode layer used in the present invention is formed between the organic EL layer and the transparent buffer layer.

The semitransparent cathode layer is not particularly limited, so long as it has transparency and electroconductivity. However, the semitransparent cathode layer preferably contains a highly reactive metal. Especially, the semitransparent cathode layer preferably contains an alkali metal or an alkaline earth metal. Particularly, the semitransparent cathode layer contains an alkali metal alone, an alkaline earth metal alone, an oxide of the alkali metal, an oxide of the alkaline earth metal, a fluoride of the alkali metal, a fluoride of the alkaline earth metal, or an organic complex of the alkali metal.

The reasons are as follows. The alkali metal and the alkaline earth metal are oxidized easily, and the electron injecting function of the semitransparent cathode layer might be lost by the oxidization of the metals. However, since the transparent electroconductive protection layer having the oxidation preventing function is formed on the semitransparent cathode layer, even if the semitransparent cathode layer contains the alkali metal or the alkaline earth metal, the semitransparent cathode layer is protected by the transparent electroconductive protection layer, and the alkali metal and the alkaline earth metal can be prevented from being oxidized with ambient oxygen. In addition, since the transparent buffer layer is formed between the semitransparent cathode layer and the transparent electroconductive protection layer, the alkali metal and the alkaline earth metal can be prevented from being oxidized through the introduction of oxygen or the release of oxygen from the target when the transparent electroconductive protection layer is formed.

As the alkali metal itself or the alkaline earth metal itself, Li, Cs, Mg, Ca, Sr, and Ba are recited, for example. As the oxide of the alkali metal and the oxide of the alkaline earth metal, magnesium oxide, strontium oxide, and lithium oxide are recited, for example. As the fluoride of the alkali metal and the fluoride of the alkaline earth metal, lithium fluoride, magnesium fluoride, strontium fluoride, calcium fluoride, barium fluoride, and the cesium fluoride are recited, for example. As the organic complex of the alkali metal, polymethyl methacrylate sodium polystyrenesulfonate is recited, for example.

The semitransparent cathode layer may be a single layer, or a laminate of plural layers.

As the semitransparent cathode layer in the form of a single layer, a single film of an alkali metal alone or an alkaline earth metal alone, such as Ca, Mg or Ba as well as a single film of an alloy, such as MgAg, between an alkali metal or an alkaline earth metal and a metal having high stability is recited. As to a Ca film functioning as a cathode layer, see Japanese Patent No. 3478824 and Appl. Phys. Lett., Vol. 58, No. 18, 1982-1984 (1991).

Moreover, as the semitransparent cathode layer made of the laminate of the plural layers, recitation may be made, for example, of a laminate made of an alkali metal or alkaline earth metal and a metal having high stability; a laminate made of a fluoride of an alkali metal or alkaline earth metal, an oxide of an alkali metal or alkaline earth metal or an organic complex of an alkali metal, and a metal having high stability; a laminate made of a fluoride of an alkali metal or alkaline earth metal, an oxide of an alkali metal or alkaline earth metal or an organic complex of an alkali metal, and an alkali metal or alkaline earth metal; a laminate made of a fluoride of an alkali metal or alkaline earth metal, an oxide of an alkali metal or alkaline earth metal or an organic complexes of an alkali metal, an alkali metal or alkaline earth metal, and a metal having high stability. Specifically, Ca/Ag, LiF/Al, LiF/Ca, and LiF/Ca/Ag are recited as examples.

Among the above-mentioned materials, the semitransparent cathode layer is preferably the single film made of the alkali metal alone, or the alkaline earth metal alone or the laminate made of the fluoride of the alkali metal or the alkaline earth metal, the oxide of the alkali metal or the alkaline earth metal or the organic complex of the alkali metal, and the alkali metal or the alkaline earth metal. Especially, the semitransparent cathode layer is preferably the single film made of Ca or the laminate of LiF/Ca. This is because they are susceptible to oxidization, but have relatively high electroconductivity and high transparency.

When a highly reactive metal such as an alkali metal or an alkaline earth metal is used for the semitransparent cathode layer, the electron injecting property to the light emitting layer can be improved. However, since the reactivity of the alkali metal or the alkaline earth metal is high as mentioned above, the electroconductivity is readily decreased through oxidation. To prevent the alkali metal and the alkaline earth metal from being oxidized, it was a common practice that a film of a metal having high stability, such as Ag or Al, was deposited on a film of an alkali metal or an alkaline earth metal or a compound thereof, or a film of an alloy between an alkali metal or an alkaline earth metal and a metal having high stability, such as Ag and Al, was used. However, the transparency of the film might decrease, if the content of the metal having high stability in the film is increased. In the present invention, since the transparent electroconductive protection layer can prevent the oxidation of the alkali metal and the alkaline earth metal contained in the semitransparent cathode layer, when the semitransparent cathode layer contains the metal with high stability, the content of that metal with high stability, that is, the content of the metal that decreases the transparency can be reduced.

The average transmittance in the visible light region (380 nm to 780 nm) of the semitransparent cathode layer is preferably not less than 10%, and more preferably not less than 50%. The method for measuring the average transmittance is the same as that described for the above-mentioned transparent buffer layer.

The thickness of the semitransparent cathode layer is not particularly limited, and is appropriately set depending upon the electroconductive material used. Specifically, the thickness of the semitransparent cathode layer is preferably in a range of 0.2 nm to 100 nm, more preferably in a range of 0.2 nm to 20 nm. The reason is as follows. If the thickness of the semitransparent cathode layer is too small, resistance might become higher. On the other hand, if the thickness of the transparent electroconductive protection layer is too large, the transmittance might become lower.

The formation process for the semitransparent cathode layer is not particularly limited, so long as it causes no influence upon the organic EL layer including such as the light emitting layer and the electron injecting layer. As the formation process for the semitransparent cathode layer, recitation is made, for example, of the chemical vapor phase growth method, and the physical vapor phase growth methods such as the vacuum vapor deposition method, the sputtering method, and the ion plating method. Among them, the chemical vapor phase growth method and the vacuum vapor deposition method are preferable. This is because, in these methods, a gasified material has a low kinetic energy for the film formation, so that the energy given to the organic EL layer including such as the light emitting layer and the electron injecting layer is small. Further, a coating method can be also used as the formation process for the semitransparent cathode layer.

Especially, the vacuum vapor deposition method is suitable as the formation process for the semitransparent cathode layer. The reason is that a gas having reactivity, such as oxygen, is not introduced in the vacuum deposition method. Therefore, even when the electron injecting layer contains a highly reactive metal, the oxidation of this metal can be avoided.

Even when the chemical vapor phase growth method, the sputtering method or the ion plating is used, it is preferable that not the reactive gas such as oxygen but a non-reactive gas such as a rare gas is introduced.

The formation process and the other points for the semitransparent cathode layer are similar to those as in the formation process for the above-mentioned transparent buffer layer, so that explanation is omitted here.

4. Contact Region, Transparent Electroconductive Protection Layer and Semitransparent Cathode Layer In the present invention, the contact region where the transparent electroconductive protection layer and the semitransparent cathode layer contact with each other is provided in the non-display area. The contact region has only to be provided in the non-display area, but the area of the contact region is not particularly limited.

Figure 2:
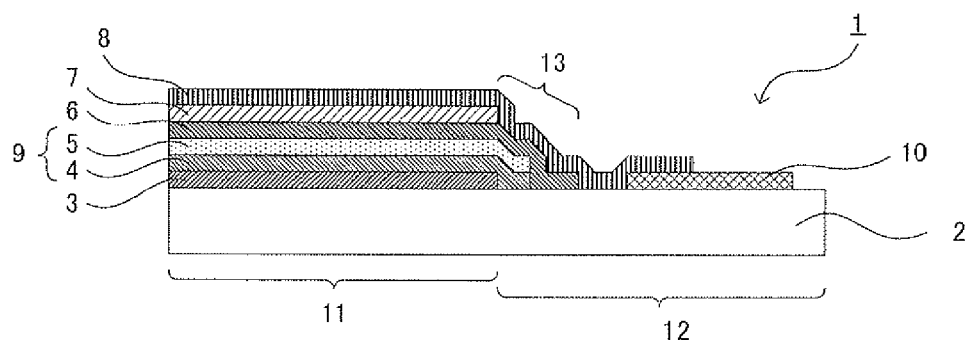
FIG. 2 is an outlined cross sectional view showing another example of the organic EL element according to the present invention.

Further, the transparent electroconductive protection layer and the semitransparent cathode layer have only to contact with each other in the non-display area. As illustrated in FIG. 1, it may be that the semitransparent cathode layer 6 contacts with the cathode take-out electrode 10, while the transparent electroconductive protection layer 8 does not contact the cathode take-out electrode 10. As illustrated in FIG. 2, it may be that the transparent electroconductive protection layer 8 contacts with the cathode take-out electrode 10, while the semitransparent cathode layer 6 does not contact the cathode take-out electrode 10. Though not illustrated, it may be that both the semitransparent cathode layer and the transparent electroconductive protection layer contact with the cathode take-out electrode.

For instance, in the organic EL device 1 shown in FIG. 1, when the cathode take-out electrode 10 is made of an electroconductive inorganic oxide such as ITO, the metal contained in the semitransparent cathode layer may be oxidized through a reaction with oxygen contained in the cathode take-out electrode. In this case, there is a possibility that it becomes difficult for the cathode take-out electrode and the semitransparent cathode layer to attain electric conduction. However, when the transparent electroconductive protection layer contacts with the cathode take-out electrode, electrons flow from the cathode take-out electrode through the transparent electroconductive protection layer, and further flow from the transparent electroconductive protection layer to semitransparent cathode layer in the contact region. As a result, it is considered that even if it becomes difficult for the cathode take-out electrode and the semitransparent cathode layer to attain electric conduction, electrons can be stably supplied to the light emitting layer.

5. Organic EL Layer

The organic EL layer used in the present invention is composed of one or more organic layers including at least the light emitting layer. In other words, the organic EL layer is the layer which includes at least the light emitting layer and is composed of one or more organic layers. When the organic EL layer is formed by the coating method, it is usually composed of one or two organic layers, since it is difficult to laminate a lot of layers in connection with of the solvent. However, it can be composed of an increased number of layers by appropriately selecting organic materials having respectively different solubilities to the solvent or by using the vacuum deposition method in combination.

As an organic layer formed in the organic EL layer besides the light emitting layer, the hole injecting layer, the hole transporting layer, the electron injecting layer and the electron transporting layer can be recited. The hole transporting layer, which is to impart the hole transporting function to the hole injecting layer, may be often integrated with the hole injecting layer. Further, the electron transporting layer, which is to impart the electron transporting function to the electron injecting layer, may be integrated with the electron injecting layer.

In addition, as the organic layer formed inside the organic EL layer, recitation is made, for example, of a layer, such as a carrier block layer, in which excitons are confined inside the light emitting layer by preventing passage of holes or electrons and further preventing diffusion of the excitons, so that recombination efficiency is improved.

As mentioned, the organic EL layer often has the laminated structure in which various layers are laminated, and there are many kinds of such a laminated structure. For instance, the laminated structure like a hole injecting and transporting layer/a light emitting layer is preferred.

Hereinafter, each of components of the organic EL layer will be described.

(1) Light Emitting Layer

The light emitting layer used in the present invention has the function that provides a field where electrons and holes are recombined to emit light.

As a material for forming the light emitting layer, a pigment based light emitting material, a metal complex based light emitting material or a polymer based light emitting material is usually used.

As the pigment based light emitting material, for example, cyclopentadiene derivatives, tetraphenyl butadiene derivatives, triphenyl amine derivatives, oxadiazol derivatives, pyrazoloquinoline derivatives, distylyl benzene derivatives, distylyl arylene derivatives, silol derivatives, a thiophene ring compound, a pyridine ring compound, perynon derivatives, perylene derivatives, oligothiophene derivatives, triphmanyl amine derivatives, coumalin derivatives, oxadiazol dimer, or pyrazoline dimer can be presented.

Moreover, as the metal complex based light emitting material, for example, metal complexes having Al, Zn, Be, Ir or Pt, or a rare earth metal such as Tb, Eu, Dy as the central metal, and oxadiazol, thiadiazol, phenyl pyridine, phenyl benzoimidazol, a quinoline structure, or the like as the ligand can be cited. As examples of the metal complex, aluminum quinolinol complex, benzoquinolinol beryllium complex, benzoxazol zinc complex, benzothiazol zinc complex, azomethyl zinc complex, porphiline zinc complex, europium complex, or iridium metal complex, or platinum metal complex can be cited. Specifically, tris(8-quinolinolato)aluminum complex (Alq3) can be presented.

As the polymer based light emitting material, recitation can be made of, for example, polyparaphenylene vinylene derivatives, polythiophene derivatives, polyparaphenylene derivatives, polysilane derivatives, polyacetylene derivatives, polyvinylcarbazole, polyfluorenone derivatives, polyfluorene derivatives, polyquinoxaline derivatives, polydialkylfluorene derivatives, and copolymers of any of them. Further, polymers of the above-mentioned pigment based light emitting materials and the above-mentioned metal complex based light emitting materials are also recited.

Moreover, a dopant that performs fluorescent emission or phosphorescent emission may be incorporated into the light emitting layer so as to improve the light emitting efficiency and change the light emission wavelength, for example. As such a dopant, for example, perylene derivatives, coumarin derivatives, rubrene derivatives, quinacridone derivatives, squalium derivatives, porphiline derivatives, styryl pigments, tetracene derivatives, pyrazoline derivatives, decacyclene, phenoxazone, quinoxaline derivatives, carbazol derivatives, and fluolene derivatives can be presented.

The thickness of the light emitting layer is not particularly limited as long as it is a thickness capable of providing the field for recombination of electrons and holes so as to provide the light emitting function. For example, it can be about 1 nm to 200 nm.

The method for forming the light emitting element is not particularly limited, so long as it enables the formation of a micropattern required by the organic EL element. As the formation method for the light emitting layer, recitation can be made, for example, of the vapor deposition method, a printing method, an ink jet method, a spin coating method, a casting method, a dipping method, a bar coating method, a blade coating method, a roll coating method, a gravure coating method, a flexographic printing method, a spray coating method, and a self-assembly method (an alternate adsorption method and a self-assembled monomolecular filming method). Among them, the vapor deposition method, the spin coating method, and the inkjet method are preferred.

When a display device of a full color display type or a multicolor display type is produced by using the organic EL element, it is necessary to form respectively a minute shape of each of the light emitting layers emitting different color and arrange them in a given arrangement. Thus, the light emitting layers need to be patterned sometimes. As a method for patterning the light emitting layers, recitation is made of a method in which each of the different light emitting colors is coded or vapor deposited through masking or a method in which each of the different light emitting colors is patterned by printing or ink jetting. Furthermore, the light emitting layers may be patterned through forming partitions among the arranged light emitting layers. The method of forming the partitions has an advantage that the light emitting material is not spread over an adjacent area through wetting, when the light emitting layer is formed with the inkjet method or the like.

As the material for forming such partitions, photosetting type resins such as a photosensitive polyimide resin and an acrylic resin, a thermosetting type resin, an inorganic material may be used, for example. In addition, a treatment by which the surface energy (wettability) of the partition forming material is changed may be performed.

(2) Hole Injecting and Transporting Layer

In the present invention, the hole injecting and transporting layer 4 may be formed between the anode layer 3 and the light emitting layer 5 as illustrated in FIG. 1. Formation of the hole injecting and transporting layer can stabilize the injection of holes into the light emitting layer and improve the light emitting efficiency.

The hole injecting and transporting layer is not particularly limited, so long as the holes injected from the anode layer can be transported into the light emitting layer. The hole injecting and transporting layer may be one consisting of either a hole injection layer or a hole transporting layer, or may be one consisting of both the hole injection layer and the hole transporting layer. The hole injecting and transporting layer may be a single layer that has both of the hole injecting function and the hole transporting function.

The material used for the hole injecting and transporting layer is not particularly limited as long as it is a material capable of stably transporting holes injected from the anode layer into the light emitting layer. As examples of the material used for the hole injecting and transporting layer, a phenyl amine based one, a star burst type amine based one, a phthalocyanine based one; oxides such as vanadium oxide, molybdenum oxide, ruthenium oxide, and aluminum oxide; amorphous carbon; or polyaniline, polythiophene, polyphenylene vinylene and derivatives thereof can be used. As a specific example, bis(N-(1-naphthyl-N-phenyl) benzidine (α-NPD), 4,4,4-tris(3-methyl phenyl phenyl amino) triphenyl amine (MTDATA), poly(3,4-ethylene dioxythiophene)-polystyrene sulfonic acid (PEDOT-PSS), and polyvinyl carbazole (PVCz) can be presented.

Moreover, the thickness of the hole injecting and transporting layer is not particularly limited as long as it is a thickness capable of sufficiently performing the function of injecting holes from the anode layer and transporting the holes to the light emitting layer. Specifically, it is in a range of 0.5 nm to 300 nm, in particular it is preferably in a range of 10 nm to 100 nm.

(3) Electron Injecting Layer

In the present invention, the electron injecting layer may be formed between the light emitting layer and the semitransparent cathode layer. The material for forming the electron injecting layer is not particularly limited, so long as the material can stabilize the injection of electrons into the light emitting layer. As the formation material of the electron injecting layer, recitation may be made, for example, of metals themselves such as alkali metals or alkaline earth metals, including strontium, calcium, lithium, and cesium; oxides of alkali metals or alkaline earth metals such as magnesium oxide, strontium oxide, and lithium oxide; fluorides of alkali metals or alkaline earth metals such as lithium fluoride, magnesium fluoride, strontium fluoride, calcium fluoride, barium fluorides, and cesium fluorides; and organic complexes of alkali metals such as polymethylmethacrylate sodium polystyrenesulfonate.

Among them, the fluorides of the alkaline earth metals are preferred since they can stabilize the organic EL layer and prolong the life thereof. This is because the reactivity of the fluorides of the alkaline earth metals with water is lower than that of the compounds of the alkali metals and the oxides of the alkaline earth metals mentioned above, and because the water absorption of the electron injecting layer during and after the formation of the electron injecting layer is smaller in the former than in the latter. This is also because the fluorides of the alkaline earth metals have higher melting points and better heat resistance and stability as compared with the compounds of the alkali metals mentioned above.

Furthermore, though the alkali metals and the alkaline earth metals are oxidized easily, so that the electron injecting function of the electron injecting layer might be lost by the oxidation of the metals. However, since the transparent electroconductive protection layer is formed on the semitransparent cathode layer, even if the semitransparent cathode layer contains the alkali metal or the alkaline earth metal, the semitransparent cathode layer is protected by the transparent electroconductive protection layer, so that the metal can be prevented from being oxidized with ambient oxygen. In addition, since the transparent buffer layer is formed between the semitransparent cathode layer and the transparent electroconductive protection layer, the metal can be prevented from being oxidized through the introduction of oxygen or the release of oxygen from the target during when the transparent electroconductive protection layer is formed.

The thickness of the electron injecting layer is preferably around 0.2 nm to around 1 nm, considering the conductivity and the transmittance of the compounds of the alkali metals and the alkaline earth metals mentioned above.

(4) Electron Transporting Layer

In the present invention, the electron transporting layer may be formed between the light emitting layer and the semitransparent cathode layer. The material for forming the electron transporting layer is not particularly limited, so long as the material can transport electrons injected from the semitransparent cathode layer or the electron injecting layer into the light emitting layer. As the material for forming the electron transporting layer, recitation may be made, for example, of phenanthroline derivatives such as bathocuproin (BCP) and bathophenanthroline (Bpehn) and quinoline derivatives such as tris(8-quinolinolato) aluminum complex (Alq3).

6. Anode Layer

The anode layer used in the present invention may be transparent or translucent, or may be not transparent or translucent. When light is taken out of both sides of the semitransparent cathode layer and the anode layer, it is preferable that the anode layer is transparent or translucent.

The material for forming the anode layer is not particularly limited, so long as it is an electroconductive material. For instance, recitation can be made of metals themselves such as Au, Ta, W, Pt, Ni, Pd, Cr, Cu, Mo, alkali metals, and alkaline earth metals, oxide of these metals, alloys including Al alloys such as AlLi, AlCa, and AlMg, Mg alloys such as MgAg, Ni alloys, Cr alloys, and alloys of alkali metals, alloys of alkaline earth metals. These electroconductive materials may be used singly or in such a way that two or more kinds of them are combined or that two or more kinds of them are laminated one upon another.

As the electroconductive material, use may be made of electroconductive inorganic oxides such as In—Sn—O, In—Zn—O, In—O, Zn—O, Zn—O—Al, and Zn—Sn—O, electroconductive polymers such as polythiophene, polyaniline, polyacetylene, polyalkylthiophene derivatives, and polysilane derivatives doped with a metal, and α-Si and α-SiC.

The thickness of the anode layer is not particularly limited, and is properly set according to the electroconductive material used. Specifically, the thickness of the anode layer is preferably in a range of 5 nm to 1000 nm, more preferably in a range of 40 nm to 500 nm. The reason is as follows. That is, when the thickness of the anode layer is too small, the resistance might become higher. On the other hand, when the thickness of the anode layer is too large, there is a possibility that for instance, the semitransparent cathode layer or the transparent electroconductive protection layer is disconnected by a step at an edge of the patterned anode layer and/or that the anode layer and the semitransparent cathode layer are short-circuited.

As the formation method of the anode layer, the chemical vapor phase growth method, the physical vapor phase growth method such as the vacuum deposition method, the sputtering method, and the ion plating method are recited, for instance.

7. Substrate

The substrate used in the present invention supports the anode layer, the organic EL layer, the semitransparent cathode layer, the transparent buffer layer, and the transparent electroconductive protection layer.

This substrate may or may not have transparency. However, when light is taken out of both sides of the semitransparent cathode layer and the anode layer, it is preferable that the substrate is transparent.

As the material for forming the substrate, inorganic materials such as quartz, glass, silicon wafer, and glass formed with TFTs (thin film transistors) can be recited, for example. In addition, as the material for forming the substrate, polymeric materials such as polycarbonate (PC), polyethylene terephthalate (PET), polybutylene terephthalate (PBT), polyphenylene sulfide (PPS), polyimide (PI), polyamide-imide (PAI), polyether sulfone (PES), polyetherimide (PEI), and polyether ether ketone (PEEK) can be recited, for example.

Among them, quartz, glass, and silicon wafer, or polyimide (PI), polyamide-imide (PAI), polyether sulfone (PES), polyetherimide (PET), and polyether ether ketone (PEEK) that are super-engineering plastics are preferred. The reason is that these materials have heat resistance against 200° C. or more, so that the temperature of the substrate can be elevated in the production step. Especially, when an active drive display device using TFT is manufactured, the above-mentioned materials can be suitably used, since the temperature becomes high in the production step.

The thickness of the substrate is properly selected, depending upon the material used and usage of the organic EL device. Specifically, the thickness of the substrate is around 0.005 mm to around 5 mm.

When the above-mentioned polymeric material is used for the substrate, the organic EL layer may be deteriorated with a gas generated from this polymeric material. Thus, a gas barrier layer is preferably formed between the substrate and the anode layer. As the material for forming the gas barrier layer, silicon oxide and silicon nitride can be recited as examples.

8. Others

The organic EL element according to the present invention may be an organic EL element of a laminated type called a multi photon emission type. That is, in the present invention, plural organic EL layers may be provided between the anode layer and the semitransparent cathode layer. In this case, an interlayer is formed between each organic EL layer.

With respect to the interlayer, see JP-A 11-329748, JP-A 2003-45676, JP-A 2003-272860, JP-A 2004-39617, and JP-A 2005-135600 for instance.

Alternatively, as the interlayer, a laminate composed of a semitransparent cathode layer, a transparent buffer layer, and a transparent electroconductive protection layer as mentioned above can be used. Such a laminate is advantageous in terms of the electron injecting characteristics as compared with a case such as where ITO and IZO are used for the interlayer.

B. Functional Device

The application scope of the present invention is not limited to the organic EL elements mentioned above. The semitransparent cathode layer, the transparent buffer layer and the transparent electroconductive protection layer in the present invention can be widely applied to functional devices in which the injecting function and the transporting function of the carriers (holes and electrons) are required, damages to be caused by impact at the time of the formation of the transparent electroconductive protective layer are desired to be controlled, and the oxidation of the metals contained in such as the semitransparent cathode layer are desired to be prevented.

The functional device according to the present invention comprises a substrate, an anode layer formed on the substrate, a functional layer formed on the anode layer and adapted to exhibit its function based on an electric field or current, a semitransparent cathode layer formed on the functional layer, a transparent buffer layer formed on the semitransparent cathode layer and having an impact buffering function, and a transparent electroconductive protection layer formed on the transparent buffer layer and having an oxidation preventing function, wherein a contact region in which the semitransparent cathode layer and the transparent electroconductive protection layer contact with each other is provided outside a region where the functional layer exhibits its function.

In the present invention, since the transparent buffer layer that has the impact buffering function is formed between the functional layer and the transparent electroconductive protection layer, the impact to the functional layer can be alleviated when the transparent electroconductive protection layer is formed. Thus, degradation in the characteristics of the functional layer can be prevented.

Moreover, the transparent electroconductive protection layer having the oxidation preventing function is formed on the semitransparent cathode layer. Therefore, when the semitransparent cathode layer or the functional layer contains a highly reactive metal, the metal can be prevented from being oxidized with ambient oxygen. In addition, since transparent buffer layer is formed between the semitransparent cathode layer and the transparent electroconductive protection layer, the metal can be prevented from being oxidized through the introduction of oxygen or the release of oxygen from the target when the transparent electroconductive protection layer is formed. Therefore, degradation in the characteristics of the semitransparent cathode layer and the functional layer can be suppressed.

Further, since the contact region where the semitransparent cathode layer and transparent electroconductive protection layer contact with each other is provided outside the region where the functional layer exhibits its function, the transparent electroconductive protection layer can assist the electroconductivity of the semitransparent cathode layer and improve the electron conductibity.

As the functional device of the present invention, an inorganic EL element, an organic thin film solar cell, an organic thin film transistor (TET), an organic field effect transistor (FET), and an organic memory can be recited as examples besides the organic EL device.

The functional layer used in the present invention is not particularly limited, so long as it exhibits its function by the electric field or current and is susceptible to damages with impact at the time of the formation of the transparent electroconductive protection layer. The functional layer is properly selected according to the kind of the functional device. Specifically, as the functional layer, the inorganic EL layer, the solar cell layer, the transistor layer, and the memory layer can be recited as examples besides the organic EL layer.

The present invention is not limited to the above-mentioned embodiments. The embodiments are merely examples, and any one having the substantially same configuration as the technological idea disclosed in the claims of the present invention and the same effects is included in the technological scope of the present invention.

EXAMPLES

Hereinafter, the present invention will be described concretely by using Examples and Comparative Examples.

Example 1

First, a thin film of indium tin oxide (ITO) (thickness: 10 nm) was formed on a glass substrate by the sputtering method, and an anode layer and a cathode take-out electrode were formed by etching. After the anode layer and the cathode take-out electrode were formed, the resulting substrate was washed, and treated with UV rays and ozone. Afterwards, a solution of polyethylene dioxythiophene-polyestylene sulfonate (abbreviated as "PEDOT-PSS") was applied on the ITO thin film by the spin coating method in the atmosphere, and a hole injecting and transporting layer (thickness: 80 nm) was formed by drying after the application.

Next, a solution of a fluorene based copolymer (manufactured by American Dye Source Inc., Product No. ADS133YE) was applied on the above hole injecting and transporting layer by the spin coating method in a glove box with thin oxygen (oxygen concentration: not more than 0.1 ppm) and low humidity (water vapor concentration: not more than 0.1 ppm), and a light emitting layer (thickness: 50 nm) was formed by drying after the application.

With respect to the substrate formed with the light emitting layer in the above, a Ca thin film (thickness: 10 nm) was formed on the substrate in vacuum (pressure: $5\times10^{-5}$ Pa) by the resistance heating deposition, thereby forming a semitransparent cathode layer. At that time, the semitransparent cathode layer was provided in a display area and a non-display area, while being formed such that it crossed over from the light emitting layer to the cathode take-out electrode.

Next, a transparent buffer layer (thickness: 10 nm) was formed by depositing a film of N,N'-bis-(3-methylphenyl)-N, N'-bis-(phenyl)-benzidine (TPD) on the semitransparent cathode layer in vacuum (pressure: $5\times10^{-5}$ Pa) by the resistance heating vapor-deposition method. At that time, the transparent buffer layer was formed in the display area, but did not cover the entire surface of the semitransparent cathode layer in the non-display area.

Then, a transparent electroconductive protection layer was formed by depositing a thin film of indium zinc oxide (IZO) (thickness: 150 nm) on the above transparent buffer layer according to a faced target sputtering method. At that time, the transparent electroconductive protection layer was formed in the region as that for the above semitransparent cathode layer.

After the formation of the transparent electroconductive protection layer, an organic EL device was obtained by sealing the resultant with non-alkaline glass in the glove box having thin oxygen (oxygen concentration: not more than 0.1 ppm) and low humidity (water vapor concentration: not more than 0.1 ppm).

Voltage (light emission starting voltage) to afford brightness of 0.01 cd/m$^2$ was measured, while voltage was being applied between the anode layer and the semitransparent cathode layer of the obtained organic EL device. The measured result was 4.7V. Further, defects such as dark spots were not produced in an area where the organic EL element was observed with unassisted eyes.

Comparative Example 1

An organic EL element was produced by the same method as in Example 1 except that a transparent buffer layer was not formed and an IZO film was formed directly on the semitransparent cathode layer.

With respect to the obtained organic EL element, the light emission starting voltage was measured in the same manner as in Example 1. The measured result was 6.0V.

From the results of Example 1 and Comparative Example 1, it was confirmed that while in the organic EL element of Comparative Example 1 where no transparent buffer layer was formed, the light emitting characteristics were deteriorated by the sputtering damage upon the semitransparent cathode layer and the light emitting layer at the time of the formation of the IZO film, such sputtering damages were suppressed in the organic EL element of Example 1 where the transparent buffer layer was formed.

Comparative Example 2

An organic EL element was produced by the same method as in Example 1 except that transparent buffer layer and IZN thin film was not formed and a thin film of Ag (thickness: 150 nm) was formed directly on the semitransparent cathode layer in vacuum (pressure: $5\times10^{-5}$ Pa) by the resistance heating vapor deposition method.

With respect to the obtained organic EL element, the light emission starting voltage was measured in the same manner as in Example 1. The measured result was 4.4V.

From the results of Example 1 and Comparative Example 2, it was confirmed that in the organic EL element of Example 1 where the transparent buffer layer was formed prior to the formation of the IZO film, even when the transparent electroconductive protection layer (IZO thin film) was formed by the sputtering method, it was possible to obtain the light emitting characteristics equivalent to those in the case where the electroconductive layer (Ag film) was formed by the resistance heating vapor deposition method.

Example 2

An organic EL element was produced by the same method as in Example 1 except that a thin film of Ag (thickness: 1 nm) was formed as a transparent buffer layer by the resistance heating vapor deposition method.

With respect to the obtained organic EL element, the light emission starting voltage was measured in the same manner as in Example 1. The measured result was 5.4V.

Example 3

An organic EL element was produced by the same method as in Example 1 except that a thin film of Ag (thickness: 10 nm) was formed as a transparent buffer layer by the resistance heating vapor deposition method.

With respect to the obtained organic EL element, the light emission starting voltage was measured in the same manner as in Example 1. The measured result was 5.3V.

From the result of Examples 1 to 3, it was confirmed that when TPD was used, the film can be made thicker as compared with the case where the metal thin film was used as the transparent buffer layer, so that degradation in the light emitting characteristics can be effectively suppressed.

Example 4

An organic EL element was produced by the same method as in Example 1 except that the thickness of a transparent buffer layer was made 10 nm.

With respect to the obtained organic EL element, the light emission starting voltage was measured in the same manner as in Example 1. The measured result was 5.3V.

From the result of Examples 1 and 4, it was confirmed that the thicker film of the transparent buffer layer gave the higher protecting effect.

Example 5

An organic EL element was produced by the same method as in Example 1 except that the thickness of a transparent buffer layer was made 500 nm With respect to the obtained organic EL element, the light emission starting voltage was measured in the same manner as in Example 1. The measured result was 4.7V. It was confirmed that even when the thickness of the transparent buffer layer is increased up to 500 nm, the protecting effect lasts.

Example 6

An organic EL element was produced by the same method as in Example 1 except that a transparent buffer layer was formed by using Alq3 instead of TPD.

With respect to the organic EL element, the light emission starting voltage was measured in the same manner as in Example 1. The measured result was 4.7V. It was confirmed that even when the Alq3 was used for the transparent buffer layer, the light emitting characteristics equivalent to those in Example 1 were obtained.

Example 7

An organic EL element was produced by the same method as in Example 1 except that a transparent buffer layer was formed by using α-NPD instead of TPD.

With respect to the organic EL element obtained, the light emission starting voltage was measured in the same manner as in Example 1. The measured result was 4.7V. It was confirmed that even when the α-NPD was used for the transparent butter layer, the light emitting characteristics equivalent to those in Example 1 were obtained.

Example 8

An organic EL element was produced by the same method as in Example 1 except that a transparent buffer layer (thickness: 100 nm) was formed by depositing a film of SiO and Ag instead of TPD through vapor co-deposition according to the resistance heating vapor deposition method. When the transparent buffer layer was formed, the volume ratio of Si and Ag in a vapor deposition source was set at SiO/Ag=97/3. Further, the deposition rate of SiO was 0.97 Å/s, and that of Ag was 0.03 Å/s.

With respect to the obtained organic EL element, the light emission starting voltage was measured in the same manner as in Example 1. The measured result was 4.1V. It was confirmed from this result that even when the vapor co-deposited film of SiO and Ag was used as the transparent buffer layer, the light emitting characteristics equivalent to those in Example 1 were obtained.

Example 9

An organic EL element was produced by the same method as in Example 1 except that a transparent buffer layer (thickness: 100 nm) was formed by the resistance heating vapor deposition method using SiO instead of TPD.

With respect to the organic EL element obtained, the light emission starting voltage was measured in the same manner as in Example 1. The measured result was 4.1V. It was confirmed that even when the SiO was used for the transparent buffer layer, the light emitting characteristics equivalent to those in Example 1 were obtained.

Example 10

First, a thin film of ITO (thickness: 150 nm) was formed on a glass substrate by the sputtering method, and an anode layer and a cathode take-out electrode were formed by etching. After the anode layer and the cathode take-out electrode were formed, the resulting substrate was washed, and treated with UV rays and ozone. Afterwards, a solution of polyethylene dioxythiophene-polyestylene sulfonate (abbreviated as "PEDOT-PSS") was applied on the ITO thin film by the spin coating method in the atmosphere, and a hole injecting and transporting layer (thickness: 80 nm) was formed by drying after the application.

Next, respective films of α-NPD (thickness: 40 nm), Alq3 (thickness: 60 nm), LiF (thickness: 0.5 nm), and Ca (thickness: 10 nm) were formed on the hole injecting and transporting layer sequentially by the resistance heating vapor deposition in vacuum (pressure: $5\times10^{-5}$ Pa), thereby forming a hole transporting layer (α-NPD), a light emitting layer (Alq3), and a semitransparent cathode layer (LiF/Ca). At that time, the semitransparent cathode layer was provided in a display area and a non-display area, while being formed such that the layer crossed over from the light emitting layer to the cathode take-out electrode.

Next, a transparent buffer layer (thickness: 10 nm) was formed by depositing a film of N,N'-bis-(3-methylphenyl)-N, N'-bis-(phenyl)-benzidine (TPD) on the semitransparent cathode layer in vacuum (pressure: $5\times10^{-5}$ Pa) by the resistance heating vapor-deposition method. At that time, the transparent buffer layer was formed in the display area, but did not cover the entire surface of the semitransparent cathode layer in the non-display area.

Then, a transparent electroconductive protection layer was formed by depositing a thin film of IZO (thickness: 150 nm) on the above-mentioned transparent buffer layer according to a faced target sputtering method. At that time, the transparent electroconductive protection layer was formed in the region as that for the above-mentioned semitransparent cathode layer.

After the formation of the transparent electroconductive protection layer, an organic EL device was obtained by sealing the resultant with non-alkaline glass in the glove box having thin oxygen (oxygen concentration: not more than 0.1 ppm) and low humidity (water vapor concentration: not more than 0.1 ppm).

With respect to the obtained organic EL element, the light emission starting voltage was measured in the same manner as in Example 1. The measured result was 2.3V. Further, defects such as dark spots were not produced in an area where the organic EL element was observed with unassisted eyes.

Comparative Example 3

An organic EL element was produced by the same method as in Example 10 except that a transparent buffer layer was not formed and an IZO film was formed directly on the semitransparent cathode layer.

With respect to the obtained organic EL element, the light emission starting voltage was measured in the same manner as in Example 1. The measured result was 2.4V.

From the results of Example 10 and Comparative Example 3, it was confirmed that the sputtering damage was restrained in the organic EL element of Example 10 where transparent buffer layer was formed.

Comparative Example 4

An organic EL element was produced by the same method as in Example 10 except that both of the transparent buffer layer and IZN thin film was not formed and a thin film of Ag (thickness: 150 nm) was formed directly on the semitransparent cathode layer in vacuum (pressure: $5 \times 10^{-5}$ Pa) by the resistance heating vapor deposition method.

With respect to the obtained organic EL element, the light emission starting voltage was measured in the same manner as in Example 1. The measured result was 2.3V.

From the results of Example 10 and Comparative Example 4, it was confirmed that in the organic EL element of Example 10 where the transparent buffer layer was formed prior to the formation of the IZO film, even when the transparent electroconductive protection layer (IZO thin film) was formed by the sputtering method, it was possible to obtain the light emitting characteristics equivalent to those in the case where the electroconductive layer (Ag film) was formed by the resistance heating vapor deposition method.

Example 11

An organic EL element was produced by the same method as in Example 10 except that a transparent buffer layer (thickness: 100 nm) was formed by depositing a film of SiO and Ag instead of TPD through vapor co-deposition according to the resistance heating vapor deposition method. When the transparent buffer layer was formed, the volume ratio of Si and Ag in a vapor deposition source was set at SiO/Ag=97/3. Further, the deposition rate of SiO was 0.97 Å/s, and that of Ag was 0.03 Å/s.

With respect to the obtained organic EL element, the light emission starting voltage was measured in the same manner as in Example 1. The measured result was 2.35V. It was confirmed from this result that even when the vapor co-deposited film of SiO and Ag was used as the transparent buffer layer, the light emitting characteristics equivalent to those in Example 10 were obtained.

Example 12

An organic EL element was produced by the same method as in Example 1 except that a transparent buffer layer was formed by using ZnS instead of TPD.

With respect to the organic EL element, the light emission starting voltage was measured in the same manner as in Example 1. The measured result was 4.7V.

Comparative Example 5

An organic EL element was produced by the same method as in Example 1 except that a transparent buffer layer was formed by using ZnS instead of TPD, a semitransparent cathode layer was provided in the display area only, and further the transparent buffer layer was provided in the display area and non-display area, while being formed so as to cover the entire surface of the semitransparent cathode layer.

With respect to the organic EL element, the light emission starting voltage was measured in the same manner as in Example 1. As a result, no light emission was observed, and the light emission starting voltage was largely increased.

From the results of Example 12 and Comparative Example 5, it was confirmed that when the semitransparent cathode layer and the transparent electroconductive protection layer had no contact point, the light emitting characteristics resulted in higher voltage depending on the electric characteristics of the transparent buffer layer, so that sufficient light emission could not be obtained.

Comparative Example 6

An organic EL element was produced by the same method as in Example 1 except that a transparent electroconductive protection layer was formed in a non-display area.

With respect to the obtained organic EL element, the light emission starting voltage was measured in the same manner as in Example 1. The measured result was 4.7V. Then, when the light emission starting voltage was measured again one day thereafter, no light emission could be obtained. Since the protection effect of the semitransparent cathode layer with the transparent electroconductive protection layer was not obtained in Comparative Example 6, it was shown that the semitransparent cathode layer was deteriorated through oxidation to decrease its electroconductivity and increase the resistance of the element.

Reference Example

Only an Ag thin film (thickness: 1 nm) was formed on a glass substrate as used in Example 1 by the resistance heating vapor deposition method. Further, only an Ag thin film (thickness: 1 nm) was similarly formed on a glass substrate by the resistance heating vapor deposition method. Measurement of the transmittances of the obtained Ag thin films with a spectrophotometer revealed that the 1 nm-thick Ag thin film and the 10 nm-thick Ag thin film gave the transmittances of 92% and 41%, respectively. It was confirmed from these results that when the thickness of the Ag thin film was not less than 10 nm, the transmittance was greatly decreased.

Only a vapor co-deposited thin film of TPD (thickness: 100 nm) was formed on a glass substrate as used in Example 1 under the film forming condition of Example 1. Measurement of the transmittance of the obtained TPD thin film with the spectrophotometer revealed that the transmittance at a wavelength of 550 nm was 96%. It was confirmed from this result that the TPD thin film had high transparency.

In addition, only a vapor co-deposited film of SiO and Ag (thickness: 10 nm) was formed on a glass substrate as used in Example 1 under the film forming condition of Example 8. Measurement of the transmittances of the obtained vapor co-deposited film of SiO and Ag with the spectrophotometer revealed that the transmittance at the wavelength of 550 nm was 98%. Thus, it was confirmed that the film had high transparency. It was also confirmed from this result that the vapor co-deposited film of SiO and Ag had high transparency even when the thickness was as large as 10 nm.

The thickness of each of the above films was a value estimated from the deposition rate based on the film thickness when each film was formed on the washed glass substrate in the form of a single film. A probe microscope (manufactured by SII Nanotechnology Inc., Nanopics 1000) was used for the measurement of the thicknesses.

What is claimed is:

1. An organic electroluminescent element comprising:
a substrate,
an anode layer formed on the substrate,
an organic electroluminescent layer formed on the anode layer and containing at least a light emitting layer,
a semitransparent cathode layer formed on the organic electroluminescent layer,
a transparent buffer layer formed on the semitransparent cathode layer and haying an impact buffering function, and
a transparent electroconductive protection layer formed on the transparent buffer layer and having an oxidation preventing function,
wherein a contact region in which the semitransparent cathode layer and the transparent electroconductive protection layer contact with each other is provided in a non-display area, and wherein a value obtained by dividing a resistivity of the transparent electroconductive protection layer provided on the non-display area by a film thickness of the transparent electroconductive protection layer is less than that obtained by dividing a resistivity of the semitransparent cathode layer provided on the non-display area by a film thickness the semitransparent cathode layer, and the transparent electroconductive protection layer provided on the non-display area functions as a bus electrode of the semitransparent cathode layer.

2. The organic electroluminescent element according to claim 1, wherein the transparent electroconductive protection layer comprises an electroconductive inorganic oxide.

3. The organic electroluminescent element according to claim 1, wherein the semitransparent cathode layer contains an alkali metal alone, an alkaline earth metal alone, an oxide of the alkali metal, an oxide of the alkaline earth metal, a fluoride of the alkali metal, a fluoride of the alkaline earth metal, or an organic complex of the alkali metal.

4. The organic electroluminescent element according to claim 2, wherein the semitransparent cathode layer contains an alkali metal alone, an alkaline earth metal alone, an oxide of the alkali metal, an oxide of the alkaline earth metal, a fluoride of the alkali metal, a fluoride of the alkaline earth metal, or an organic complex of the alkali metal.

* * * * *